United States Patent
Hekstra et al.

(10) Patent No.: US 7,197,689 B2
(45) Date of Patent: Mar. 27, 2007

(54) TRELLIS-BASED RECEIVER

(75) Inventors: Andries Pieter Hekstra, Eindhoven (NL); Constant Paul Marie Jozef Baggen, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/532,930

(22) PCT Filed: Sep. 22, 2003

(86) PCT No.: PCT/IB03/04241

§ 371 (c)(1),
(2), (4) Date: Apr. 27, 2005

(87) PCT Pub. No.: WO2004/040771

PCT Pub. Date: May 13, 2004

(65) Prior Publication Data

US 2006/0090121 A1      Apr. 27, 2006

(30) Foreign Application Priority Data

Oct. 30, 2002   (EP)   ................................. 02079512

(51) Int. Cl.
*H03M 13/03* (2006.01)
(52) U.S. Cl. ...................... 714/792; 714/794; 714/796; 714/795; 714/748; 375/262; 375/341; 375/265
(58) Field of Classification Search ........ 714/794–796, 714/791–792; 375/265, 262, 341
See application file for complete search history.

(56) References Cited

U.S. PATENT DOCUMENTS 5,537,444 A  *  7/1996  Nill et al. .................... 375/341
6,126,310 A  * 10/2000  Osthoff et al. ............... 714/751
6,418,549 B1 *  7/2002  Ramchandran et al. ..... 714/811
6,507,927 B1 *  1/2003  Kalliojarvi ................... 714/795
6,892,343 B2 *  5/2005  Sayood et al. .............. 714/779

OTHER PUBLICATIONS

IEEE Trans on Comm. vol. 43, No. 2/3/4, Feb./Mar./Apr. 1995, List and Soft Symbol Output Viterbi Algorithms: Extensions and Comparisons, Nill et al. pp. 277-287.

* cited by examiner

Primary Examiner—Guy J. Lamarre

(57) ABSTRACT

Receivers (1) for receiving encoded block signals and comprising processor systems (2) decode block signals by using Viterbi algorithms for finding a first candidate/path in a trellis (18) and by generating cost signals for finding further candidates/paths in said trellis (18). To reduce storage capacity, cost signals are combined for series of branches and cumulated cost is compared with thresholds. While searching for said further paths, a search for a further path is made in view of cumulated cost exceeding a threshold or not. The insight of indirectly constructing a list of candidates and the basic idea of more directly constructing said list brings more control. These receivers are less complex, and are further improved by introducing increasing thresholds per trellis and successive combining and different trellis directions for generating and cumulating cost signals and combining in a lexicographical order, and using a check sum for list reduction and by making error detections.

10 Claims, 1 Drawing Sheet

TRELLIS-BASED RECEIVER

Figure 1:
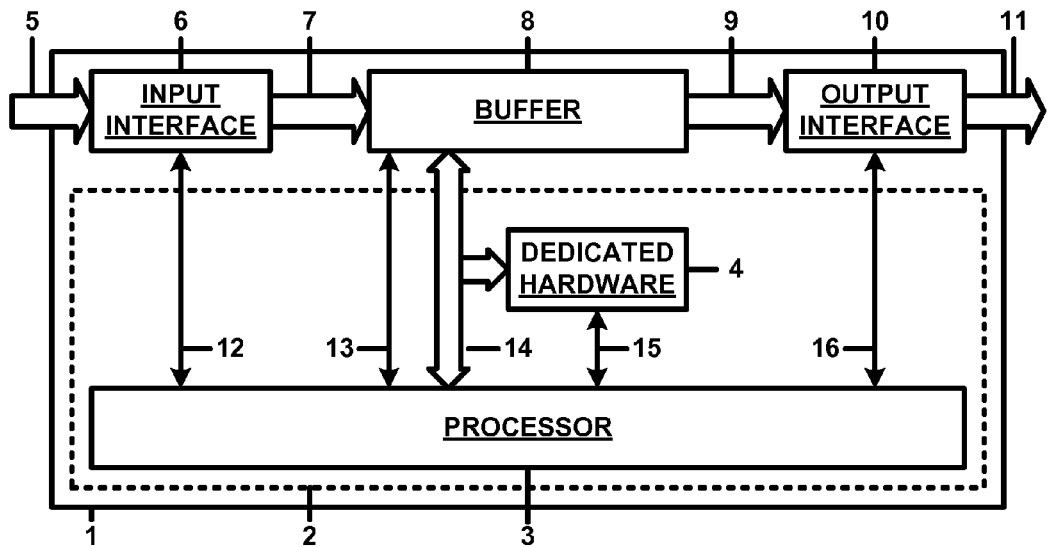

The invention relates to a receiver for receiving at least one encoded block signal and which receiver comprises a processor system.

The invention also relates to a processor system for use in such a receiver, and to a method for use in such a receiver, and to a processor program product to be run via such a processor system.

Such a receiver forms for example part of a mobile phone or forms for example part of a base station or a node station in a mobile telecommunication network etc. Said encoded block signal comprises for example a convolutional code, which is to be decoded by for example a Viterbi algorithm. A Viterbi algorithm is algorithmically equivalent to a solution to the problem of finding the shortest path through a labeled graph or trellis. This corresponds to maximum likelihood decoding. Said processor system, in dependence on said block signal, generates branch signals defining branches of a trellis and generates node signals defining nodes of said trellis and generates path signals defining paths in said trellis for selecting a candidate for said block signal. This selecting corresponds for example to choosing the candidate that gives the largest value of the (log)likelihood (ratio) function.

A prior-art receiver is known from the article "List and Soft Output Viterbi Algorithms: Extensions and Comparisons", by Christiane Nill and Carl-Erik Sundberg, IEEE Transactions on Communications, Vol. 43, No. 2/3/4/February/March/April 1995, pages 277–287, which discloses, in addition to the generation of branch signals defining branches of a trellis (in said article, branch signals are called metrics) and the generation of node signals defining nodes of said trellis (in said article, nodes are called states and node signals for example correspond to cumulative metrics), the generation of cost signals defining cost per branch (in said article, said cost corresponds to $\Delta$ being the absolute difference between certain cumulative metrics or between certain cumulated metrics) and the generation of path signals defining paths in said trellis for creating a list of candidates for said block signal. Such a list of candidates improves the chance of finding the right candidate (improved decoding gain).

The known receiver is disadvantageous, inter alia, due to the need to find the minimum absolute difference $\Delta_{min}$ of a large number of absolute differences $\Delta$ per candidate for creating said list of candidates. This search is complex and time-consuming and requires large storage capacity.

It is an object of the invention, inter alia, to provide a receiver as defined above which requires less storage capacity.

Further objects of the invention, inter alia, are to provide a processor system for use in such a receiver, and a method for use in such a receiver, and a processor program product to be run via such a processor system, which require less storage capacity.

The receiver according to the invention for receiving at least one encoded block signal comprises a processor system for generating branch signals, in dependence on said block signal, said branch signals defining branches of a trellis and generating node signals defining nodes of said trellis, and generating cost signals defining cost per branch, and generating path signals defining paths in said trellis for selecting candidates for said block signal, wherein said processor system combines cost signals for series of branches and compares cumulated cost with thresholds for said selecting of candidates.

By combining cost signals for series of branches and comparing cumulated cost with thresholds, compared in said prior-art article, said selecting of candidates is now done completely differently: where in said prior-art article said minimum absolute difference needed to be found per candidate for creating the list of candidates (by finding the Viterbi path in said trellis, a first candidate is found, and by finding further paths in said trellis, and selecting a number of further paths having the lowest minimum absolute differences $\Delta_{min}$), according to the invention, while searching for said further paths, a search for a further path (comprising series of branches) is made as long as the cumulated cost does not exceed and/or are equal to a threshold. When the cost exceeds and/or is equal to a threshold, said search is stopped. As a result, a list of candidates can be found, just as in said prior art article, but without requiring large storage capacity (finding said minimum is done for all nodes of a further path, and for all further paths, with many signals to be stored and to be processed, where said cumulating just involves the repeated adding of signals and storing of results). Furthermore, the receiver according to the invention is less complex (finding a minimum is more complex than cumulating cost and comparing cumulated cost with thresholds), and is less time-consuming (finding said minimum is done for all further paths found, where said cumulating and comparing sometimes will result in the rejection of a path before said path has been found completely); alternatively, when not being less time-consuming but being allowed to use the same amount of time as said prior art receiver, the receiver according to the invention will create a larger list and then have an improved decoding gain.

In a first embodiment of the receiver according to the invention, said processor system compares said cumulated cost with increasing thresholds per trellis, with cost signals being a function of branch signals and/or node signals.

By comparing said cumulated cost with increasing thresholds per trellis, with cost signals being a function of branch signals and/or node signals, a first threshold will result in finding the smallest list, a second (increased) threshold will result in finding a larger list etc. This allows optimum use of the available time and storage capacity.

In a second embodiment of the receiver according to the invention, said processor system combines at least some of said cost signals for series of branches by concatenating a first series of one or more branches and a second series of one or more branches which have at least one node in common.

By combining at least some of said cost signals for series of branches by concatenating a first series of one or more branches and a second series of one or more branches which have at least one node in common, said list is found through successive combining.

In a third embodiment of the receiver according to the invention, said processor system generates said cost signals in a first trellis direction and combines cost signals in a second trellis direction, with said first trellis direction and said second trellis direction being different.

By generating said cost signals in a first trellis direction and combining cost signals in a second trellis direction, with said first trellis direction and said second trellis direction being different, said list is found in a very efficient way.

In a fourth embodiment of the receiver according to the invention, said processor system combines said cost signals for at least three series of one or more branches, with a first series of one or more branches being lexicographically smaller than a second series of one or more branches and with the second series of one or more branches being lexicographically smaller than a third series of one or more branches.

By combining said cost signals for at least three series of one or more branches (so the cost signals are combined per series), with a first series of one or more branches being lexicographically smaller than a second series of one or more branches and with the second series of one or more branches being lexicographically smaller than a third series of one or more branches, said list is found in a most efficient way.

In a fifth embodiment of the receiver according to the invention, said processor system detects a check sum of said candidates, with a first sub-part being used for list reduction and with a second sub-part being used for error detection.

By detecting a check sum of said candidates, with a first sub-part being used for list reduction and with a second sub-part being used for error detection, the chance of finding the right candidate from said list of candidates is improved and/or said list is further reduced.

In a sixth embodiment of the receiver according to the invention, said processor system in case of zero candidates satisfying a list reduction criterion requests a data retransmission or orders an audio/video action and in case of one candidate satisfying a list reduction criterion selects this candidate and in case of two or more candidates satisfying a list reduction criterion selects the candidate with the lowest cost, with said processor system testing the selected candidate via an error detection criterion.

By requesting, in case of zero candidates satisfying a list reduction criterion, a data retransmission or ordering an audio/video action (audio action and/or video action like for example a concealment action etc.) and, in case of one candidate satisfying a list reduction criterion, selecting this candidate and, in case of two or more candidates satisfying a list reduction criterion, selecting the candidate with the lowest cost, with said processor system testing the selected candidate via an error detection criterion, said list reduction and said error detection are combined in optimal fashion.

Embodiments of the processor system according to the invention and of the method according to the invention and of the processor program product according to the invention correspond to the embodiments of the receiver according to the invention.

The invention is based upon an insight, inter alia, that constructing a list through finding a minimum absolute difference per candidate (in other words by finding further paths in said trellis, and selecting a number of further paths having the lowest minimum absolute differences $\Delta_{min}$) is an indirect construction requiring large storage capacity, and is based upon a basic idea, inter alia, that said list should be constructed more directly.

The invention solves the problem, inter alia, of providing a receiver which requires less storage capacity, and is advantageous, inter alia, in that said direct constructing of said list is now more controlled (by comparing cumulated cost with thresholds).

These and other aspects of the invention will be apparent from and elucidated with reference to the embodiment(s) described hereinafter.

Figure 2:
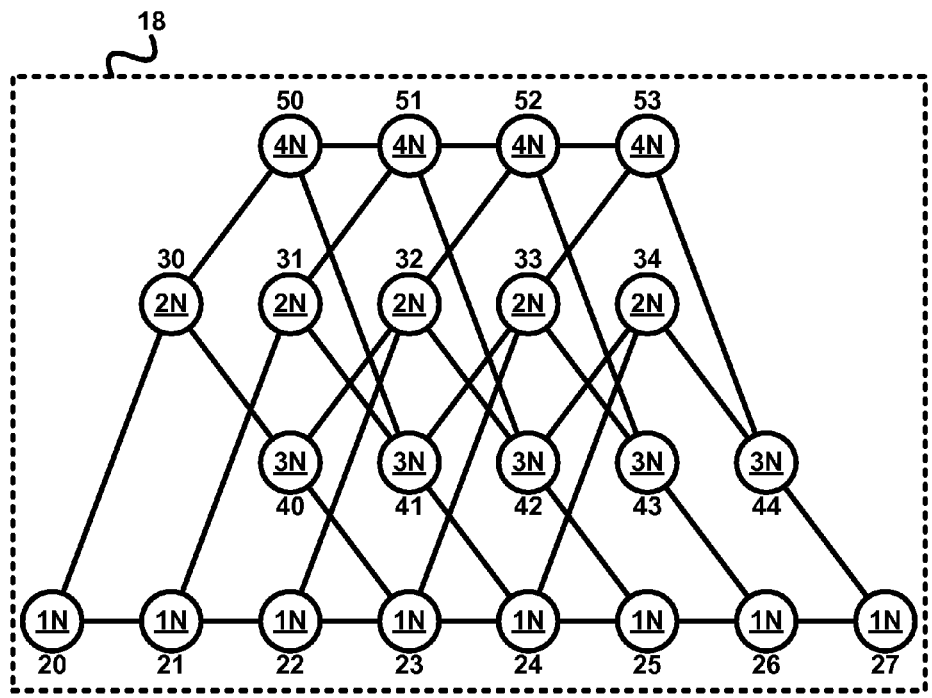

FIG. 1 illustrates in a block diagram a receiver according to the invention comprising a processor system according to the invention, and FIG. 2 illustrates a trellis for clarifying processes in a receiver according to the invention and in a processor system according to the invention, and for clarifying steps of a method according to the invention and functions of a processor program product according to the invention.

The receiver 1 according to the invention shown in FIG. 1 such as, for example, a mobile phone or a base station or a node station in a mobile telecommunication network etc. comprises a processor system 2 which comprises a processor 3 (including one or more processors and one or more memories (not shown) etc.) and dedicated hardware 4. Said processor 3 is coupled to said dedicated hardware via a data coupling 14 for data exchange etc. and via a control coupling 15 for control purposes. An input 5 of receiver 1 is coupled to for example an antenna etc. (not shown) for receiving encoded block signals, which input 5 is further coupled to an input of an interface 6 for interfacing said encoded block signals like for example amplifying and/or demodulating and/or filtering and/or equalizing and/or bit-detecting encoded block signals etc. Interface 6 is coupled to said processor 3 via a control coupling 12 for control purposes. An output of interface 6 is coupled via a data coupling 7 to an input of a buffer 8 for storing said encoded block signals. Buffer 8 is coupled to processor 3 via a control coupling 13 for control purposes and via a data coupling 14 for data exchange, to allow stored encoded block signals to be processed such as, for example, to be decoded etc. An output of buffer 8 is coupled via a data coupling 9 to an input of an interface 10 for interfacing said processed signals like for example demultiplexing and/or D/A-converting etc. Interface 10 is coupled to said processor 3 via a control coupling 16 for control purposes. An output of interface 10 is coupled to an output 11 of receiver 1, which output 11 is further coupled to for example a man-machine-interface or MMI etc. (not shown).

The trellis 18 shown in FIG. 2 comprises eight first nodes (or states) ("1N") 20–27, five second nodes (or states) ("2N") 30–34, five third nodes (or states) ("3N") 40–44 and four fourth nodes (or states) ("4N") 50–53. Node 20 is located at time unit 0, nodes 21,30 are located at time 1, nodes 22,40,31,50 are located at time unit 2, nodes 23,41, 32,51 are located at time unit 3, nodes 24,42,33,52 are located at time unit 4, nodes 25,43,34,53 are located at time unit 5, nodes 26,44 are located at time unit 6, and node 27 is located at time unit 7. Branches can be found between nodes 20 and 30, 20 and 21, 21 and 31, 21 and 22, 22 and 32, 22 and 23, 23 and 33, 23 and 24, 24 and 34, 24 and 25, 25 and 26, 26 and 27, 23 and 40, 24 and 41, 25 and 42, 26 and 43, 27 and 44, 40 and 30, 40 and 32, 41 and 31, 41 and 50, 41 and 33, 42 and 32, 42 and 51, 42 and 34, 43 and 33, 43 and 52, 44 and 34, 44 and 53, 30 and 50, 31 and 51, 32 and 52, 33 and 53, 50 and 51, 51 and 52, and 52 and 53. This is a trellis for a (3,1,2) code with $G(D)=[1+D, 1+D^2, 1+D+D^2]$ and with an information sequence of length L=5 and containing L+m+1 time units labeled from 0 to L+m (with m+2 according to this example.

Receiver 1 and processor system 2 function as follows. Encoded block signals arriving at input 5 are, after being interfaced in interface 6, stored in buffer 8. Said encoded block signals comprise for example convolutional codes, which are to be decoded by for example a Viterbi algorithm. Processor system 2, in dependence on each block signal, generates branch signals defining branches of trellis 18 and generates node signals defining nodes of said trellis 18 and then generates path signals defining paths in said trellis 18 for selecting a candidate for said block signal. So, for each block signal, a trellis is generated, and the Viterbi algorithm running via processor system 2 defines a path indicating the candidate for said block signal. A Viterbi algorithm is equivalent to a solution to the problem of finding the shortest path through a labeled graph or trellis. This corresponds to maximum likelihood decoding. Said selecting of said candidate corresponds for example to choosing the candidate that gives the largest value of the (log)likelihood(ratio) function.

As described in detail in the book "Error Control Coding"—"Fundamentals and Applications" by Shu Lin and Daniel J. Costello Jr. (Prentice-Hall, Inc. Englewood Cliffs, N.J. 07632, 1983, ISBN 0-13-283796-X, in particular Chapters 10 and 11), the Viterbi algorithm begins at time unit j=m, computes the branch signals (log)likelihood functions) for the branches entering each node, stores the branch with the largest combination of branch signal and/plus node signal (the survivor), then increases j by 1, computes the combinations of branch signal and/plus node signal (loglikelihood functions) for the branches entering each node by adding the branch signal entering that node to the node signal of the connecting node at the preceding time unit, stores, for each node, the path with the largest combination of branch signal and/plus node signal (the survivor), eliminates all other paths, then increases j again by 1 etc. as long as j<L+m, otherwise the Viterbi algorithm is finished.

The final survivor is the maximum likelihood path. However, the candidate found this way is the most likely candidate, but not necessarily the right candidate. To improve the chance of finding the right candidate, the article "List and Soft Output Viterbi Algorithms: Extensions and Comparisons", by Christiane Nill and Carl-Erik Sundberg (IEEE Transactions on Communications, Vol. 43, No. 2/3/4/February/March/April 1995, pages 277–287) discloses, in addition to the generation of branch signals defining branches of a trellis (in said article, branch signals are called metrics) and the generation of node signals defining nodes of said trellis (in said article, nodes are called states and node signals for example correspond to cumulative metrics), the generation of cost signals defining cost per branch (in said article, said cost corresponds to $\Delta$ being the absolute difference between certain cumulative metrics or between certain cumulated metrics) and the generation of path signals defining paths in said trellis for selecting a list of candidates for said block signal. Such a list of candidates (comprising the Viterbi survivor plus some other likely candidates) improves the chance of finding the right candidate (improved decoding gain).

In said article, Sundberg presents a List Viterbi Algorithm (LVA), that successively produces the i-th, i=1,2,3, . . . , L, most likely candidate. First, the i=1 most likely candidate is produced, which corresponds to the Viterbi path or the maximum likelihood path. The second most likely path (i=2) is then produced next by searching along the Viterbi path which node on the Viterbi path has a minimal absolute $\Delta$. This $\Delta$ corresponds to an excursion from the Viterbi path for which the sum of the branch signals over the excursion has a minimal difference from the corresponding part of the Viterbi path. Next, the candidate (path) for which the sum of the branch signals gives the third highest (log)likelihood (sum of branch signals) value (when sorted in decreasing order) is searched for by finding the minimum $\Delta$ along the paths that gave the second highest (log)likelihood (sum of branch signals), etc.

So, according to said article, the minimum absolute difference $\Delta_{min}$ of a large number of absolute differences $\Delta$ per candidate for creating said list of candidates must be found. This search is complex and time-consuming and requires large storage capacity, which can increase proportionally to the number of candidates that is generated.

According to the invention, receiver 1 for receiving at least one encoded block signal comprises processor system 2 for, in dependence on said block signal,
generating branch signals defining branches of a trellis, node signals defining nodes of said trellis, cost signals defining costs per branch, and path signals defining paths in said trellis for selecting candidates for said block signal, and
combining cost signals for series of branches and comparing cumulated cost with thresholds for said selecting of candidates.

By combining cost signals for series of branches and comparing cumulated cost with thresholds, compared to said prior art article, said selecting of candidates is now done completely differently: while searching for said further paths, a search for a further path (comprising series of branches) is made as long as the cumulated cost does not exceed and/or are equal to a threshold. When the cost exceeds and/or is equal to a threshold, said search is stopped and a search for one or more yet further paths is started. As a result, a list of candidates can be found, just as in said prior art article, but without requiring large storage capacity.

For practical purposes it is advantageous to use loglikelihood representations for the branch signals and node signals, so that the combinations of node signals and branch signals computed as part of the Viterbi algorithm and the combinations of cost signals and cumulated cost according to the invention are in fact summations (which have a lower computational complexity than multiplications). However, to a person skilled in the art it will be evident that it is also possible to implement the invention, and the Viterbi algorithm, by using likelihoods instead of loglikelihoods, so that said combinations and cumulations are in fact products.

More in detail, according to the invention, the branch signals are branch metrics (e.g. sums of Euclidean distances between the branch labels and the received channel output values), and the node signals are what are usually called the path metrics of the nodes or the state metrics in the Viterbi algorithm. Furthermore, the cost signals per branch for example correspond to the absolute $\Delta$ described in said article. These $\Delta$s are usually computed as part of the Viterbi algorithm in the Add-Compare-Select operations, but are not normally stored. According to the invention, these $\Delta$s need to be stored. However, the storage capacity required for these $\Delta$s is very limited and, moreover, unlike what is the case in said article, this storage capacity does not increase when the typical number of candidates for the encoded block signal that are to be selected is increased (e.g. to hundreds or more). The "typical" number of candidates is an outcome of the algorithm and not an input parameter. With the message symbols for example being binary symbols (for example bits), of all branches that enter a given node (in FIG. 2, the branches in between nodes 23 and 24 and in between nodes 41 and 24 both entering node 24), one will have the maximum sum of node signal (of nodes 41 or 24) and branch signal, which we called the surviving branch for that node. In case said maximum is not unique, an arbitrary choice among the incoming branches is made.

The cost per branch of a branch that is a surviving branch is defined to be zero. The cost per branch of a branch that is not a surviving branch is defined to be the $\Delta$ of the node at which the branch ends (e.g. node 24). An arbitrary path from the start node of the trellis (node 20) to the final node of the trellis (node 27) can be considered a series of branches, and the cost of such a path is defined as the sum over all branches on that path of the cost per branch. The cost of a path P thus defined equal the sum over all branches of the Viterbi (maximum likelihood) path of the branch signals minus the sum over the branch signals of all branches of the path P. Thus, the cost of a path quantify the degradation in (log) likelihood of that path with respect to the maximum (log) likelihood over all paths. As a result, a comparison of the sum (accumulation) of cost per branch with an upper limit (threshold) gives direct information whether the path concerned has a (log)likelihood that is not lower than the (log)likelihood of the Viterbi path by more than a set limit (threshold). An advantage over the approach of said article is that the decision whether or not a path P is in the decoded list, according to the invention, does not depend on the (log)likelihood of other paths than P, which makes the (computations in the) invention less complex.

The set of all paths in the trellis can be ordered as a tree with the final node of the trellis as its root. The set of all paths for which the sum of the cost per branch is at most a threshold is a subtree of this tree. If, for example in FIG. 2, the series of branches from the final node of the trellis (node 27), to node 44, to node 53, to node 33 has a sum of cost per branch that exceeds a given value of the threshold, then all paths from the final node of the trellis to the start node of the trellis that start with the series of branches through said nodes (nodes 27, 44, 53, 33) will also exceed said threshold because any additional branch will have non-negative cost values. This way, by performing computations on just four nodes (nodes 27, 44, 53, 33), many paths have been eliminated, which saves many computations.

First supporting design: The available time and storage capacity are optimally used by comparing said cumulated cost with increasing thresholds per trellis (with cost signals being a function of branch signals and/or node signals): a first threshold will result in finding the smallest list, a second (increased) threshold will result in finding a larger list, a third (further increased) threshold will result in finding a further larger list, etc.

With encoded block signals for example being received at fixed time intervals, a fixed amount of processing time is available per encoded block signal to do the processing for the technique that is the subject of this invention. In general, the number of candidate block signals produced for a given value of the threshold is a random variable, that depends on the quality of the (radio) reception (more candidates at lower reception quality) and the like. In general, therefore also, the number of computations to be performed for a given value of the threshold is a random variable, which is, in general, a steeply increasing function of the threshold. By starting selecting candidates with a small threshold value, the fixed computation time will suffice with a high degree of certainty to complete this selection procedure. By successively trying larger values of the threshold until the computation time expires, the largest set of candidates can be selected that is feasible within the computation time available. The longer the lists that can be produced, the more candidate-encoded block signals from which a choice can be made, the more chance that there will be a candidate free of errors.

Second supporting design: According to a successive combining technology, a complete list is found/constructed with all data being available simultaneously in an efficient manner. This is done by combining at least some of said cost signals for series of branches by concatenating a first series of one or more branches and a second series of one or more branches having at least one node in common.

The trellis is for example split into sections. Initially, there are as many sections as there are stages in the trellis (in FIG. 2, the stages consist of a number of branches in between nodes at time unit 0 and 1, 1 and 2, 2 and 3, 3 and 4, 4 and 5, 5 and 6, and 6 and 7: seven sections). For each section, a set of allowed branches along with their cost are stored. A branch is allowed if its branch signal is at most a threshold (possibly a reduced threshold where the reduction depends on other knowledge that can be available from Viterbi processing in one or more directions). Of all nodes, the survivor branches have zero cost per branch and are defined to be allowed. Of all nodes, branches that are not survivor branches are only allowed if the cost per branch is at most a threshold. This completes the initialization step. Next, a pair of sections that are adjacent in time are chosen. In a preferred embodiment, pairs of sections with few branches, or pairs of sections for which the number of combinations of a branch from one section and a connecting branch from the other section is small (low computational complexity) are chosen first. Now, the two original sections are replaced by a combined section of allowed series (of length 2) of branches. Here a series of branches is allowed (if the branches form a connected sequence) and the accumulation of the cost per branch over the series is at most the (reduced) threshold.

This successive combining technology continues to combine two adjacent sections by a new section, where the order in which pairs of adjacent sections are picked is not merely "left-to-right" or "right-to-left" but may be optimized on-the-fly to minimize the computational complexity of making the combinations and storing the sections. Another approach could for example be to first combine the sections at pairs of time units (combine section of branches in between nodes at time units 0 and 1 with those in between nodes at time units 1 and 2, similarly combine those in between 2 and 3 with those in between 3 and 4, similarly combine those in between 4 and 5 with those in between 5 and 6). Next, form sections that contain series of up to four branches (combine section of branches in between nodes at time units 0 and 2 with those in between nodes at time units 2 and 4, similarly combine section of branches in between nodes at time units 4 and 6 with those in between nodes at time units 6 and 7), etc. (finally combine section of branches in between nodes at time units 0 and 4 with those in between nodes at time units 4 and 7). In the end, a section which spans the entire trellis is obtained, which yields the set of candidates for the encoded block signal.

Third supporting design: A list can be found very efficiently by generating said costs signals in a first trellis direction and combining cost signals in a second trellis direction, with said first trellis direction and said second trellis direction being different.

In addition to what has been described above about paths that start with a series of branches from the final node of the trellis (node 27), to node 44, to node 53, to node 33, it is assumed that the Viterbi processing and the generation of the Δs proceeds from the start node of the trellis (node 20) to the final node of the trellis (node 27). Thus, for example the Δ of node 33 comprises information about the processed information in the piece of the trellis in between time unit 0 and time unit 4. It is exactly this range of time units that considers the extensions of trellis paths that start from the final node of the trellis (node 27), to node 44, to node 53, to node 33. For example the Δ of node 33 gives information about the additional cost of proceeding with the survivor branch (e.g. to node 41) of node 33 or proceeding with the non-survivor branch (e.g. node 23) from node 33.

Fourth supporting design: A list can be found in a most efficient way by combining said cost signals for at least three series of one or more branches, with a first series of one or more branches being lexicographically smaller than a second series of one or more branches and with the second series of one or more branches being lexicographically smaller than a third series of one or more branches.

When selecting all paths for which the sum of the cost per branch can be identified by what is called a backtracking procedure or depth-first tree search, less storage capacity is required compared to for example a breadth-first tree search. A backtracking procedure searches through the aforementioned tree of all trellis paths that end in the final node of the trellis, where trellis paths are considered to be series of branches. A backtracking procedure exploits the fact that, if a certain series of branches has a sum of cost signals per branch that exceeds a set threshold, then all extensions of that series of branches to paths that not only start at the final node of the trellis (the root of the tree) but also end in the start node of the trellis, must have an accumulation (sum) of cost signals that are at least as large, and thus exceed the threshold and therefore these paths cannot be candidates for the encoded block signal. While a backtracking procedure also uses shorter series of branches, it needs an ordering of series of branches, which include paths that span the entire trellis as special cases. A possible ordering for backtracking is a lexicographic ordering. The name of this ordering reminds one of the fact that it is akin to what is used in a dictionary. According to an example, a series of branches is described starting from the final node of the trellis by a first sequence of the following message bits 010001. This means inter alia that the second to last bit shifted in the encoder was a "1" and the last bit shifted in it was a "0". Another series of branches is represented by a second sequence of the following message bits 01010000. When the "0" is considered a letter "a" in the alphabet of letters and the "1" a "b" in the alphabet of letters, then the first sequence of message symbols would come before the second sequence of message symbols in a dictionary (because the first three letters of both sequences of message symbols are identical and the fourth letter of the second sequence of message symbols is situated later in the alphabet). Similarly, the sequence of message symbols 0100010001 would come later in the lexicon than the first sequence, just because it coincides with the first sequence in all its positions and is longer. The property "comes later in the dictionary, as explained above", is equivalent to "is lexicographically larger". This way, the backtracking procedure first assesses the cost signal of just one branch, represented as the sequence of message symbols 0. The cost of the sequence of just one branch is either zero or the $\Delta_1$ of the final node of the trellis, depending on whether the 0-message symbol branch of the final node of the trellis is a surviving branch or not. In case it is a surviving branch and it has zero cost, which is always less than any (assumedly positive) threshold. Then, the algorithm extends the path with a "0", which yields 00. Now suppose this second "0" is not a surviving branch, and has cost $\Delta_2$ so that the cumulated cost up to this point is $0+\Delta_2=\Delta_2$, and assume that this exceeds the threshold. Then, all paths from the final node of the trellis that tart with "00" cannot give candidates for the selected block signal because their cost will be as large as $\Delta_2$ or larger. Now, the algorithm goes one bit back ("back-tracking"), to the path 0 and extends this path with a "1" (it stores that it visited the 0-extension already), which yields 01. Then, it computes the sum of the cost signals for these two branches, etc. In this very small example, it is already evident that the series of branches visited so far 0, 00, 01 is a lexicographically increasing sequence of series of branches (message symbols).

Instead of visiting the series of branches in lexicographically increasing order, using a lexicographically decreasing order will allow a similar procedure to the one outlined above.

In the technique that is the subject of this invention, one can achieve that the first path that the backtracking procedure will explore is the Viterbi path. Suppose branches are not represented as series of message bits, as above, but as series of letters, where the letter "X" indicates that the branch was a surviving branch, and the letter "Y" indicates that the branch was a not a surviving branch. Then sequences of "X"/"Y" letters can be formed, which is used to define the ordering. The Viterbi path corresponds to the sequence of letters XXXXXXXXX . . . XXXX, which is lexicographically the smallest. This path has zero cost and is "allowed", in the sense that it is a valid candidate for the encoded block signal, for any (by assumedly positive) threshold. Using this lexicographic ordering, a similar example can be given to the one above.

In an implementation, it is not necessary to actually generate the letter "X" or "Y" etc., this is just given for explanatory reasons to describe the ordering in which series of branches are searched.

Fifth supporting design: The chance that the right candidate can be found from said list of candidates can be increased and/or said list can be further reduced by detecting a check sum included in said candidates, with a first sub-part being used for list reduction and with a second sub-part being used for error detection.

Blocks of message symbols that are encoded with an error correcting code such as a convolutional code may contain a check sum, for example a cyclic redundancy check (CRC). Such a CRC is then incorporated to detect and/or correct decoding errors of the decoder of the convolutional code, e.g. a Viterbi decoder. In case the trellis-based receiver produces a plurality of candidates for the encoded block signal along with their cost signals, the probability of identifying the right candidate in this plurality can be enhanced by eliminating all candidates for which the message part of the path signal does not match the check sum part of the path signal. When not all check sum symbols are tested for correctness to eliminate candidates (in other words to reduce the list), the remaining check sum symbols can be used for error detection and/or error correction purposes as was originally intended. In an implementation, it may be tested whether for a candidate (a number of) the check sum symbols match the message symbols, and in case there is no match said candidate does not need to be stored to save storage capacity.

Sixth supporting design: Said list reduction and said error detection can be combined in optimal fashion by—in case of zero candidates satisfying a list reduction criterion requesting a data retransmission or ordering an audio/video action (audio action and/or video action like for example a concealment action for concealing an audio signal and/or a video signal resulting from an incorrectly decoded or non-decoded block signal etc.) and—in case of one candidate satisfying a list reduction criterion, selecting this candidate and—in case of two or more candidates satisfying a list reduction criterion, selecting the candidate with the lowest cost, with said processor system testing the selected candidate via an error detection criterion.

After the plurality of candidates of encoded block signals has been reduced by eliminating block signals for which (a part of) a check sum is not satisfied, when zero candidates remain, this may provide valuable information. In case of data applications, the action could generally be to request a retransmission, or to read the part concerned again from for example a disk. In case of audio and/or video applications, delay constraints can prohibit retransmission of information, and error concealment or recovery actions are to be preferred. In case more than one candidate remains after list reduction, the probability that a candidate with a lower cost signal (higher (log)likelihood) is the right candidate is larger than the probability that a candidate with a higher cost signal (lower (log)likelihood) is the right candidate. In an implementation, to save storage capacity, it may not only be tested whether for a candidate (a number of) the check sum symbols match the message symbols, and there is no match said candidate needs not be stored but it may also be tested whether for this candidate the accumulation of cost signals is smaller than the smallest accumulation of cost signals of any candidate observed so far, for which (part of) the check sum and the remainder of the message matched.

Said first supporting design supports/improves said combining of cost signals for series of branches and said comparing of cumulated cost with thresholds. Said second supporting design supports/improves said combining and said comparing and/or supports/improves said first supporting design. Said third supporting design supports/improves said combining and said comparing and/or supports/improves said first supporting design and/or supports/improves said second supporting design. Said fourth supporting design will usually support/improve said third supporting design, however, support/improvement for said combining and said comparing and/or for said first supporting design and/or for said second supporting design are not to be excluded. Said fifth supporting design supports/improves said combining and said comparing and/or supports/improves said first supporting design and/or supports/improves said second supporting design and/or supports/improves said third supporting design and/or supports/improves said fourth supporting design. Said sixth supporting design will usually support/improve said fifth supporting design.

The invention can also be applied when the message symbols and/or encoded symbols are non-binary. Then, the trellis becomes non-binary in the sense that nodes can have more than two incoming branches. For a binary trellis, when there are at most two incoming branches, where the Viterbi algorithm generates the sum of a node signal plus the branch signal, there is only one difference of these two sums ($\Delta$ being the absolute value of this difference). In case of a non-binary trellis, there are more than two said sums and thus more than one $\Delta$ per node can be formed, each $\Delta$ being attributed to a pair of branches. For a given node, the Viterbi algorithm then selects the maximum of said sums of the incoming branches to the given node. The incoming branch to a node that has the maximum sum is called the survivor branch. The cost per branch of a survivor incoming branch to any node can then be defined to be zero (as in the binary case). The cost per branch of a branch that is not a survivor branch can then be defined as the aforementioned $\Delta$ of the pair of branches that is formed by the branch itself and the survivor branch.

The (branch) cost signals define the cost per branch. Alternatively, (node) cost signals defining the cost per node could be defined and used. A branch is determined by two nodes, so that the (branch) cost signals and the (node) cost signals can always be converted into each other. However, due to, according to the invention, the combining of cost signals and the comparing of cumulated cost with thresholds, which is done for series of branches, it is more convenient to use the (branch) cost signals.

Instead of time units, for example when applying the invention in storage applications, other axes could be used for defining units, like for example a spatial axis. When applying the invention to storage applications, the receiver according to the invention will correspond to a decoder. Generally, a decoder will generate decoded data, where the receiver according to the invention will generate at least partially decoded data.

The invention is based upon an insight, inter alia, that constructing a list through finding a minimum absolute difference per candidate (in other words by finding further paths in said trellis, and selecting a number of further paths having the lowest minimum absolute differences $\Delta_{min}$) is an indirect construction requiring large storage capacity, and is based upon a basic idea, inter alia, that said list should be constructed more directly.

The invention solves the problem, inter alia, of providing a receiver which requires less storage capacity, and is advantageous, inter alia, in that said direct constructing of said list is now more controlled (by comparing cumulated cost with thresholds).

The expression "for" in for example "for receiving" and "for generating" does not exclude that other functions are performed as well, simultaneously or not. The expressions "X coupled to Y" and "a coupling between X and Y" and "coupling/couples X and Y" etc. do not exclude that an element Z is in between X and Y. The expressions "P comprises Q" and "P comprising Q" etc. do not exclude that an element R is comprised/included as well. The terms "a" and "an" do not exclude the possible presence of one or more pluralities.

The invention claimed is:

1. A receiver for receiving at least one encoded block signal and comprising a processor system for generating branch signals in dependence on said block signal, said branch signals defining branches of a trellis, and generating node signals defining nodes of said trellis, and generating cost signals defining cost per branch, and generating path signals defining paths in said trellis for selecting candidates for said block signal, wherein said processor system combines cost signals for series of branches and compares cumulated cost with thresholds for said selecting of candidates.

2. The receiver according to claim 1, wherein said processor system compares said cumulated cost with increasing thresholds per trellis, with cost signals being a function of branch signals and/or node signals.

3. The receiver according to claim 1 or 2, wherein said processor system combines at least some of said cost signals for series of branches by concatenating a first series of one or more branches and a second series of one or more branches which have at least one node in common.

4. The receiver according to claim 1 or 2, wherein said processor system generates said cost signals in a first trellis direction and combines cost signals in a second trellis direction, with said first trellis direction and said second trellis direction being different.

5. The receiver according to claim 4, wherein said processor system combines said cost signals for at least three series of one or more branches, with a first series of one or more branches being lexicographically smaller than a second series of one or more branches and with the second series of one or more branches being lexicographically smaller than a third series of one or more branches.

6. The receiver according to claim 1 or 2, wherein said processor system detects a check sum of said candidates, with a first sub-part being used for list reduction and with a second sub-part being used for error detection.

7. The receiver according to claim 6, wherein said processor system in case of zero candidates satisfying a list reduction criterion requests a data retransmission or orders an audio/video action and in case of one candidate satisfying a list reduction criterion selects this candidate and in case of two or more candidates satisfying a list reduction criterion selects the candidate with the lowest cost, with said processor system testing the selected candidate via an error detection criterion.

8. A processor system for use in a receiver for receiving at least one encoded block signal and comprising said processor system for, in dependence on said block signal, generating branch signals defining branches of a trellis and generating node signals defining nodes of said trellis and generating cost signals defining cost per branch and generating path signals defining paths in said trellis for selecting candidates for said block signal, wherein said processor system combines cost signals for series of branches and compares cumulated cost with thresholds for said selecting of candidates.

9. A method for use in a receiver for receiving at least one encoded block signal and comprising the steps of, in dependence on said block signal, generating branch signals defining branches of a trellis and generating node signals defining nodes of said trellis, and generating cost signals defining cost per branch, and generating path signals defining paths in said trellis for selecting candidates for said block signal, wherein said method comprises the steps of combining cost signals for series of branches and comparing cumulated cost with thresholds for said selecting of candidates.

10. A processor program product to be run on a processor system for use in a receiver for receiving at least one encoded block signal and comprising said processor system, which processor program product comprises the functions of, in dependence on said block signal, generating branch signals defining branches of a trellis, and generating node signals defining nodes of said trellis, and generating cost signals defining cost per branch and generating path signals defining paths in said trellis for selecting candidates for said block signal, wherein said processor program product comprises the functions of combining cost signals for series of branches and comparing cumulated cost with thresholds for said selecting of candidates.

* * * * *